(12) United States Patent
Pradeep et al.

(10) Patent No.: US 6,294,480 B1
(45) Date of Patent: *Sep. 25, 2001

(54) METHOD FOR FORMING AN L-SHAPED SPACER WITH A DISPOSABLE ORGANIC TOP COATING

(75) Inventors: Yelehanka Ramachandramurthy Pradeep; Jie Yu; Minghui Fan; Chiew Wah Yap, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 09/443,427

(22) Filed: Nov. 19, 1999

(51) Int. Cl.[7] .......................... H01L 21/31; H01L 21/469
(52) U.S. Cl. .......................... 438/763; 438/696; 438/723; 438/763; 438/787
(58) Field of Search ................................ 438/230, 231, 438/301, 303, 304, 305, 306, 307, 506, 576, 696, 723, 724, 738, 743, 744, 763, 787

(56) References Cited

U.S. PATENT DOCUMENTS

| | | | |
|---|---|---|---|
| 4,838,991 | 6/1989 | Cote et al. | 156/643 |
| 4,868,617 | 9/1989 | Chiao et al. | 357/23.3 |
| 5,024,959 | 6/1991 | Pfiester | 437/34 |
| 5,069,747 | * 12/1991 | Cathey et al. | 438/696 |
| 5,234,852 | 8/1993 | Liou | 437/44 |
| 5,290,720 | * 3/1994 | Chen | 438/304 |
| 5,397,733 | * 3/1995 | Jang | 438/439 |
| 5,714,413 | * 2/1998 | Brigham et al. | 438/301 |
| 5,770,508 | 6/1998 | Yeh et al. | 438/305 |
| 5,858,847 | 1/1999 | Zhou et al. | 438/305 |
| 5,882,973 | 3/1999 | Gardner et al. | 438/279 |
| 5,897,349 | * 4/1999 | Agnello | 438/230 |
| 6,156,598 | * 12/2000 | Zhou et al. | 438/231 |

\* cited by examiner

*Primary Examiner*—Chandra Chaudhari
*Assistant Examiner*—Asok Kumar Sarkar
(74) *Attorney, Agent, or Firm*—George O. Saile; Rosemary L. S. Pike; William J. Stoffel

(57) ABSTRACT

A method for forming an L-shaped spacer using a sacrificial organic top coating. A semiconductor structure is provided having a gate structure thereon. A liner oxide layer is formed on the gate structure. A dielectric spacer layer is formed on the liner oxide layer. In the preferred embodiment, the dielectric spacer layer comprises a silicon nitride layer or a silicon oxynitride layer. A sacrificial organic layer is formed on the dielectric spacer layer. The sacrificial organic layer and the dielectric spacer layer are anisotropically etched to form spacers comprising a triangle-shaped sacrificial organic structure and an L-shaped dielectric spacer. The triangle-shaped sacrificial organic structure is removed leaving an L-shaped dielectric spacer.

17 Claims, 2 Drawing Sheets

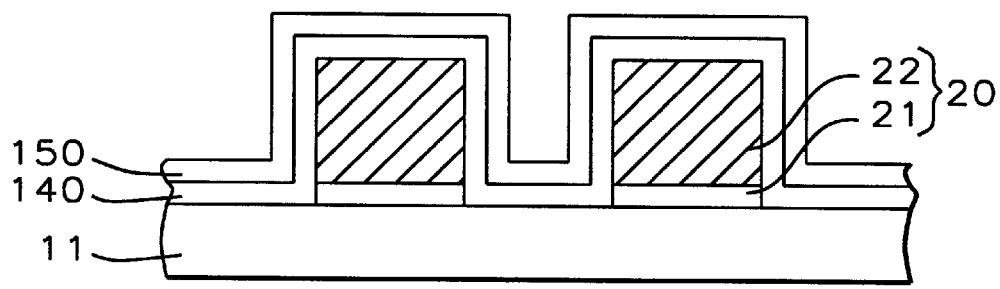
FIG. 1 — Prior Art
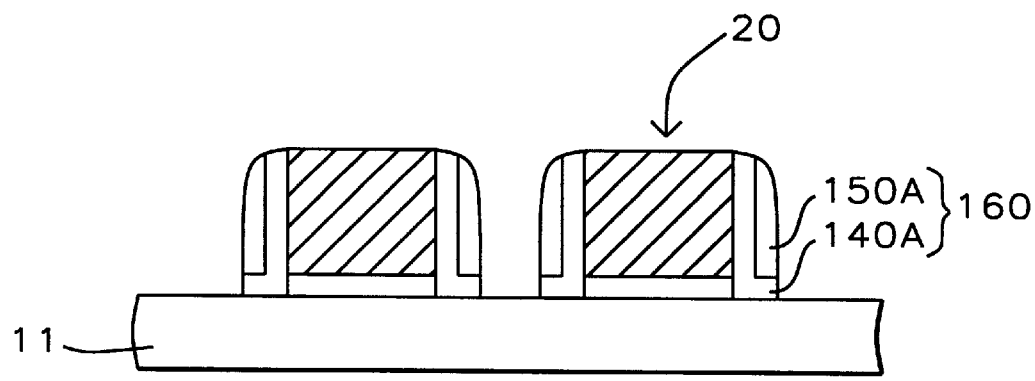
FIG. 2 — Prior Art
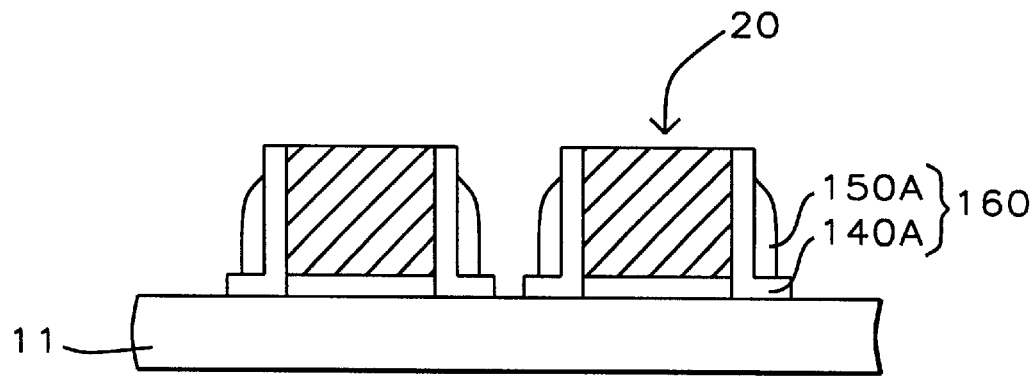
FIG. 3 — Prior Art

METHOD FOR FORMING AN L-SHAPED SPACER WITH A DISPOSABLE ORGANIC TOP COATING

BACKGROUND OF INVENTION

1. Field of the Invention

This invention relates generally to fabrication of a semiconductor device and more particularly to a method for forming an L-shaped spacer using a sacrificial organic top coating.

2. Description of the Prior Art

As the physical geometry of semiconductors continues to shrink, the space between gate electrodes shrinks as well. The reduced space between gate electrodes can cause poor gap fill by the subsequent dielectric layer (eg inter-layer dielectric) resulting in degraded performance.

One approach which has been used to solve this problem is the use of spacers on the gate electrode sidewalls which are smaller at the top than they are at the bottom, such as L-shaped spacers. In a typical L-shaped spacer two dielectric layers (the first composed of silicon nitride and the second composed of silicon oxide) are formed over and around a gate electrode, then anisotropically etched. However, the top oxide portion of the spacer can not be easily removed without damaging oxide isolation structures. Conversely, if the top oxide portion of the spacer remains, it can be effected by post-etch wet chemical process causing inconsistent spacer shape and size across the IC and between IC's. Also, the gap filling ability of the subsequent dielectric layer is not optimized, because the aspect ratio remains high due to the presence of the oxide portion of the spacers.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 4,838,991 (Cote et al.) recites a process for defining organic sidewall structures on a photoresist pattern to enhance a photolithography process.

U.S. Pat. No. 5,858,847 (Zhou et al.) shows a LDD process using a photoresist block over a hard mask and surrounded by a polymer layer to provide a highly-doped source and drain implant mask, then removing the polymer layer and photoresist block for the lightly-doped source and drain implant.

U.S. Pat. No. 4,868,617 (Chiao et al.) and U.S. Pat. No. 5,024,959 (fiester) show L-shaped spacers and processes.

U.S. Pat. No. 5,882,973 (Gardner et al.) shows double spacers used to increase the length of source and drain extensions for particular transistors in an IC.

U.S. Pat. No. 5,234,852 (Liou) shows sloped spacers formed using a reflowable material.

U.S. Pat. No. 5,770,508 (Yeh et al.) shows a process for forming an L-shaped spacer using an oxide layer and an overlying nitride layer, anisotropically etching to form spacers, then removing the nitride layer, leaving an L-shaped oxide spacer. Ions are implanted through the L-shaped spacer to form shallow source and drain extensions under the L-shaped spacer and moderate depth source and drain regions beyond the L-shaped spacer.

SUMMARY OF THE INVENTION

It is an object of the present invention to provide a method for forming an L-shaped spacer using an organic top coating.

It is another object of the present invention to provide a method for forming an L-shaped spacer that has a reduced susceptibility to post-etch wet chemical processing.

It is another object of the present invention to provide a method for forming an L-shaped spacer that provides for better gap filling properties of the subsequently formed, overlying dielectric layer.

It is yet another object of the present invention to provide a method for forming an L-shaped dielectric spacer with a reduced cycle time and a reduced thermal budget.

To accomplish the above objectives, the present invention provides a method for forming an L-shaped spacer using a sacrificial organic top coating. A semiconductor structure is provided having a gate structure thereon. A liner oxide layer is formed on the gate structure. A dielectric spacer layer is formed on the liner oxide layer. In the preferred embodiment, the dielectric spacer layer comprises a silicon nitride layer or a silicon oxynitride layer. A sacrificial organic layer is formed on the dielectric spacer layer. The sacrificial organic layer and the dielectric spacer layer are anisotropically etched to form spacers comprising a triangle-shaped sacrificial organic structure and an L-shaped dielectric spacer. The liner oxide layer can act as an etch stop for the anisotropic etch process. The triangle-shaped sacrificial organic structure is removed using an etch selective to the L-shaped dielectric spacer, leaving an L-shaped dielectric spacer which is sufficiently open to provide for good gap filling properties of the overlying dielectric layer.

The present invention provides considerable improvement over the prior art. The sacrificial organic layer can be deposited in less time than an oxide layer, as is used in the prior art, reducing cycle time. The organic dielectric layer also requires a lower thermal budget to form than does an oxide layer. The spacer which results from the process of the present invention is less susceptible to post-etch wet chemical processing than an oxide layer, resulting in a more uniform spacers, both across the IC and between IC's. Because the sacrificial organic structure can be completely removed using a selective etch, the resulting L-shaped dielectric spacers are open and provide better gap filling properties of the subsequent dielectric layer (eg interlevel dielectric).

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 through 3 illustrate sequential sectional views of a process for according to a process known by the inventors to have a problem.

DETAILED DESCRIPTION OF THE INVENTION

Figure 4:
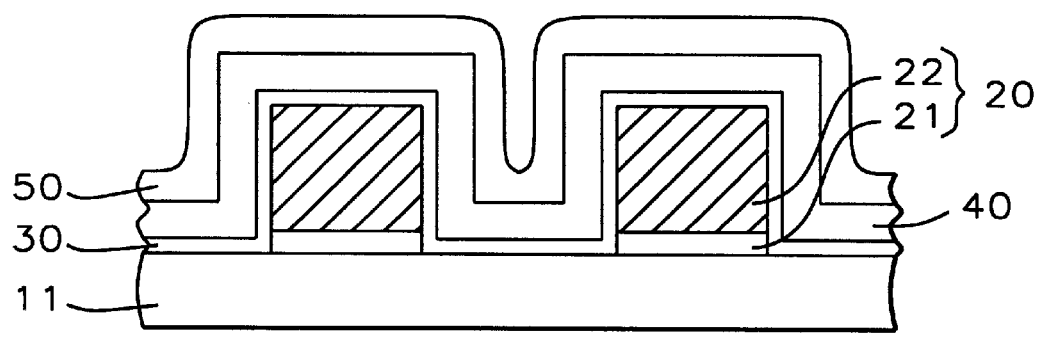
FIG. 4 through 6 illustrate a preferred embodiment of a method for forming L-shaped spacers using a sacrificial organic top coat according to the present invention.

The present invention will be described in detail with reference to the accompanying drawings. The present invention provides a method for forming an L-shaped spacer using a sacrificial organic top coating.

PROBLEM IDENTIFIED BY THE INVENTORS

A process for forming an L-shaped spacer known by the inventors to have a problem is described with reference to FIGS. 1 through 3. In the problem process, a semiconductor structure (11) is provided having a gate structure (20) thereon, as shown in FIG. 1. The gate typically comprises a gate oxide layer (21) with an overlying gate electrode (22). A nitride layer (140) is formed over the gate structure (20) and an oxide layer (150) is formed on the nitride layer (140).

As shown in FIG. 2, an L-shaped spacer (160) is formed by anisotropically etching the oxide layer (150) and the nitride layer (140). The remaining nitride layer (140A) of the L-shaped spacer (160) is shaped like the letter "L". One problem with this process identified by the inventors is that the remaining oxide layer (150) of the L-shaped spacer can not be easily removed using a selective oxide etch, because it would damage isolation structures which are typically used to isolate various active areas on an IC. Leaving the oxide layer (150) intact aggravates the gap-fill problem for closely spaced gates.

Also, as shown in FIG. 3, the shape and size of the remaining oxide layer (150A) of the L-shaped spacer (160) can be altered by post-etch wet chemical processes which are typically used in IC fabrication. Wet chemical processes, particularly HF processes will reduce the size of the oxide layer (150). The reduction in size is dependant upon the length of the exposure which can vary across the IC between IC's. Variations in the shape and size of the L-shaped spacers results in inconsistent performance parameters for the transistor formed from the gates with the L-shaped spacers.

PREFERRED EMBODIMENT OF THE PRESENT INVENTION

A preferred embodiment of the present invention is described with reference to FIGS. 4 through 6. The preferred embodiment provides a method for forming an L-shaped spacer using an organic top coat. The present invention provides a consistently controllable opening which is adequate for good gap-filling characteristics. Also, the organic top coat can be formed faster than an oxide layer using a lower thermal budget.

Referring to FIG. 4, the preferred embodiment of the present invention begins by providing a semiconductor structure (11). Semiconductor substrate (11) is understood to possibly include a substrate comprising a wafer of semiconductor material such as silicon or germanium or a like substrate structure such as silicon-on-insulator (SOI) as is known in the art. Semiconductor structure (11) should be understood to possibly further include one or more conductive and/or insulating layers and passive and/or active devices formed on or over said substrate. The semiconductor structure (11) has a gate structure (20) thereon. The gate structure (20) typically comprises a gate dielectric layer (21) and a gate electrode (22) as is known in the art. The gate electrode (22) typically comprises doped polysilicon.

Still referring to FIG. 4, a liner oxide layer (30) is formed on the gate structure (20). The liner oxide layer (30) is preferably composed of thermally grown silicon dioxide or TEOS deposited using a chemical vapor deposition process. The liner oxide layer preferably has a thickness of between about 50 Angstroms and 250 Angstroms. The liner oxide layer (30) is important to prevent out diffusion of dopant ions from the gate electrode and also to provide an etch stop for a subsequent silicon nitride etch.

Still referring to FIG. 4, a dielectric spacer layer (40) is formed on the liner oxide layer (30). The dielectric spacer layer (40) preferably comprises silicon nitride or silicon oxynitride. The dielectric spacer layer can be formed using a chemical vapor deposition process, a plasma enhanced chemical vapor deposition process, or a JET chemical vapor deposition process and preferably has a thickness of between about 200 Angstroms and 500 Angstroms.

Referring again to FIG. 4, a sacrificial organic layer (50) is formed on the dielectric spacer layer (40). The sacrificial organic layer (50) is preferably composed of a semi-conformal organic material such as propylene glycol monomethyl ether. The sacrificial organic layer (50) can be formed using spin coating process, and preferably has a thickness of between about 300 Angstroms and 1000 Angstroms.

Figure 5:
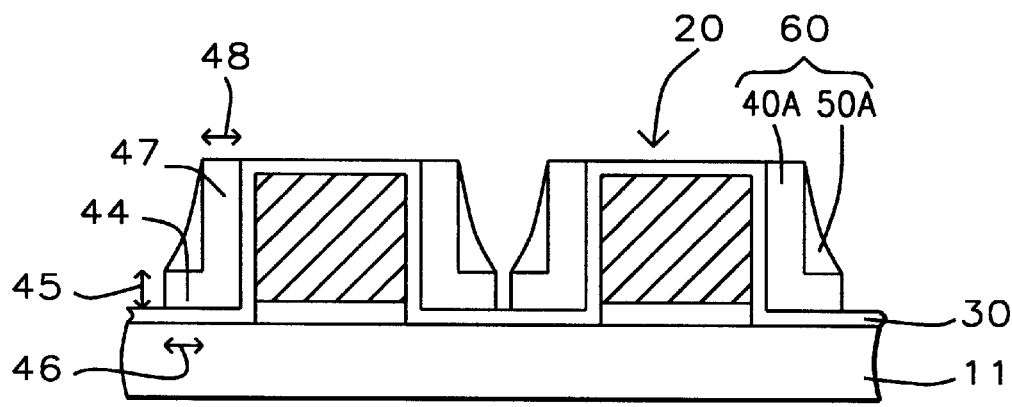

Referring to FIG. 5, the sacrificial organic layer (50) and the dielectric spacer layer (40) are anisotropically etched to form spacers (60) comprising a triangle-shaped sacrificial organic structure (50A) and an L-shaped dielectric spacer (40A). The anisotropic etch is preferably performed using a plasma etch process with a $CF_4/HBr/O_2$ or $Cl_2/O_2$ chemistry for the sacrificial organic layer (50) and a $SF_6/HBr$ or $CF_4/HBr$ chemistry for the dielectric spacer layer (40). The liner oxide layer (30) preferably acts as an etch stop. The triangle-shaped sacrificial organic structure (50A) preferably has a thickness of between about 200 Angstroms and 900 Angstroms at its base and a height dependant upon the height of the gate electrode (22) (typically between about 1500 Angstroms and 3000 Angstroms). The L-shaped dielectric spacer (40A) has a horizontal leg (44) and a vertical leg (47). The horizontal leg (44) preferably has a thickness (45) of between about 200 Angstroms and 500 Angstroms and a width (46) of between about 200 Angstroms and 900 Angstroms. The vertical leg (47) preferably has a thickness (48) of between about 200 Angstroms and 500.

Figure 6:
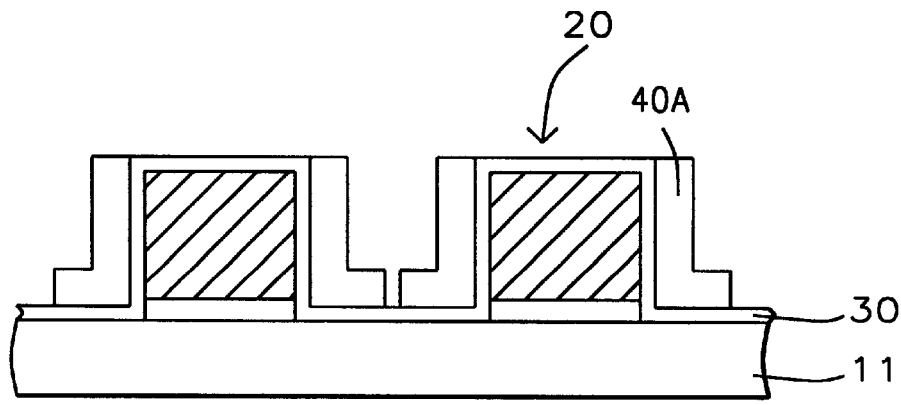

Referring to FIG. 6, the triangle-shaped sacrificial organic structure (50A) is removed leaving an L-shaped dielectric spacer (40A). The triangle-shaped sacrificial organic structure (50A) is preferably removed using an etch selective to the dielectric spacer layer, such as an $O_2$ plasma stripping process which provides an etch selectivity of the sacrificial organic structure to the dielectric spacer layer of at least 100:1.

The key advantages of the present invention are that the sacrificial organic layer can be formed in less time than an oxide layer as is used in the prior art, reducing cycle time. Also, the sacrificial organic layer formation requires less thermal budget than an oxide layer formation. The L-shaped spacer formed according to the present invention is less susceptible to changes in size and shape due to post-etching wet chemical processing, compared to prior art L-shaped spacers. Since the triangle-shaped sacrificial organic structure can be completely removed, the L-shaped dielectric spacer is more open providing for better gap filling of the subsequent dielectric layer.

While the invention has been particularly shown and described with reference to the preferred embodiments thereof, it will be understood by those skilled in the art that various changes in form and details may be made without departing from the spirit and scope of the invention.

What is claimed is:

1. A method for forming an L-shaped spacer using a sacrificial organic top coating, comprising the steps of:

a. providing a semiconductor structure having a gate structure thereon;

b. forming a liner oxide layer on said gate structure;

c. forming a dielectric spacer layer on said liner oxide layer;

d. forming a sacrificial organic layer on said dielectric spacer layer;

e. anisotropically etching said sacrificial organic layer and said dielectric spacer layer to form spacers comprising a triangle-shaped sacrificial organic structure and an L-shaped dielectric spacer; and f. removing said triangle-shaped sacrificial organic structure.

2. The method of claim 1 wherein said dielectric spacer layer comprises a silicon nitride layer having a thickness of between about 200 Angstroms and 500 Angstroms.

3. The method of claim 1 wherein said dielectric spacer layer comprises a silicon oxynitride layer having a thickness of between about 200 Angstroms and 500 Angstroms.

4. The method of claim 1 wherein said sacrificial organic layer comprises propylene glycol monomethyl ether having a thickness of between about 300 Angstroms and 1000 Angstroms.

5. The method of claim 1 wherein said sacrificial organic layer and said spacer dielectric layer are anisotropically etched using a plasma etch process with a $CF_4/HBr/O_2$ chemistry or a $Cl_2/O_2$ chemistry for said sacrificial organic layer and a $SF_6/HBr$ chemistry or a $CF_4/HBr$ chemistry for said dielectric spacer layer, and said liner oxide layer acts as an etch stop.

6. The method of claim 1 wherein said sacrificial organic structure is removed using an $O_2$ plasma stripping process having a selectivity of said sacrificial organic structure to said L-shaped dielectric spacer of at least 100:1.

7. The method of claim 1 wherein said L-shaped dielectric spacer has a horizontal leg having a thickness of between about 200 Angstroms and 500 Angstroms and a width of between about 200 Angstroms and 900 Angstroms, and a vertical leg having a thickness of between about 200 Angstroms and 500 Angstroms.

8. A method for forming an L-shaped spacer using a sacrificial organic top coating, comprising the steps of:

a. providing a semiconductor structure having a gate structure thereon;

b. forming a liner oxide layer on said gate structure;

c. forming a dielectric spacer layer on said liner oxide layer; said dielectric spacer layer comprising silicon nitride or silicon oxynitirde;

d. forming a sacrificial organic layer on said dielectric spacer layer;

e. anisotropically etching said sacrificial organic layer and said dielectric spacer layer to form spacers comprising a triangle-shaped sacrificial organic structure and an L-shaped dielectric spacer; and f. removing said triangle-shaped sacrificial organic structure using an $O_2$ plasma stripping process.

9. The method of claim 8 wherein said dielectric spacer layer comprises silicon nitride having a thickness of between about 200 Angstroms and 500 Angstroms.

10. The method of claim 8 wherein said dielectric spacer layer comprises silicon oxynitirde having a thickness of between about 200 Angstroms and 500 Angstroms.

11. The method of claim 8 wherein said sacrificial organic layer comprises propylene glycol monomethyl ether having a thickness of between about 300 Angstroms and 1000 Angstroms.

12. The method of claim 9 wherein said sacrificial organic layer comprises propylene glycol monomethyl ether having a thickness of between about 300 Angstroms and 1000 Angstroms.

13. The method of claim 10 wherein said sacrificial organic layer comprises propylene glycol monomethyl ether having a thickness of between about 300 Angstroms and 1000 Angstroms.

14. The method of claim 11 wherein said sacrificial organic layer and said spacer dielectric layer are anisotropically etched using a plasma etch process with a $CF_4/HBr/O_2$ chemistry or a $Cl_2/O_2$ chemistry for said sacrificial organic layer and a $SF_6/HBr$ chemistry or a $CF_4/HBr$ chemistry for said dielectric spacer layer, and said liner oxide layer acts as an etch stop.

15. The method of claim 11 wherein said sacrificial organic structure is removed using an $O_2$ plasma stripping process having a selectivity of said sacrificial organic structure to said L-shaped dielectric spacer of at least 100:1.

16. The method of claim 14 wherein said sacrificial organic structure is removed using an $O_2$ plasma stripping process having a selectivity of said sacrificial organic structure to said L-shaped dielectric spacer of at least 100:1.

17. The method of claim 8 wherein said L-shaped dielectric spacer has a horizontal leg having a thickness of between about 200 Angstroms and 500 Angstroms and a width of between about 200 Angstroms and 900 Angstroms, and a vertical leg having a thickness of between about 200 Angstroms and 500 Angstroms.

* * * * *